United States Patent [19]

Taylor

[11] 4,183,058
[45] Jan. 8, 1980

[54] VIDEO STORE

[75] Inventor: Richard J. Taylor, London, England

[73] Assignee: Micro Consultants, Limited, Berkshire, England

[21] Appl. No.: 764,148

[22] Filed: Jan. 31, 1977

[30] Foreign Application Priority Data

Feb. 19, 1976 [GB] United Kingdom ................ 6585/76

[51] Int. Cl.² ............................................ H04N 5/76
[52] U.S. Cl. .................................. 358/127; 358/134; 358/138; 358/140
[58] Field of Search ............... 358/134, 140, 136, 138, 358/127

[56] References Cited

U.S. PATENT DOCUMENTS

| 3,740,466 | 6/1973 | Marshall | 358/105 |
| 3,937,878 | 2/1976 | Judice | 358/136 |
| 3,950,608 | 4/1976 | Noda | 358/256 |
| 3,969,577 | 7/1976 | Lloyd | 358/136 |
| 3,970,776 | 7/1976 | Kinuhata | 358/140 |
| 4,057,836 | 11/1977 | Munsey | 358/138 |

Primary Examiner—Howard W. Britton
Attorney, Agent, or Firm—Dowell & Dowell

[57] ABSTRACT

A video data store including at least one storage device containing a plurality of storage elements together with input and output data latches. A queueing control receives write and read store commands and temporarily holds the command if a store cycle is in progress. Timing means receive the write and read commands from the queueing control and produces timing signals required for accessing the storage devices. The store may thus be operated in an asynchronous manner.

13 Claims, 10 Drawing Figures

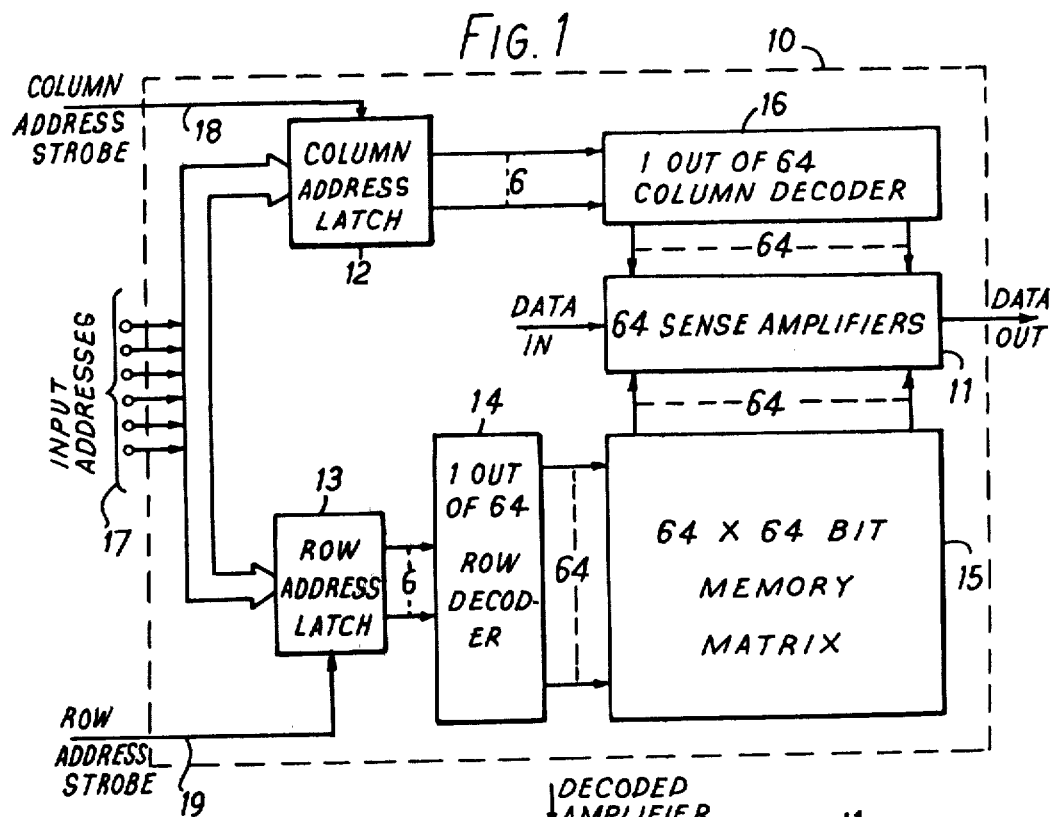
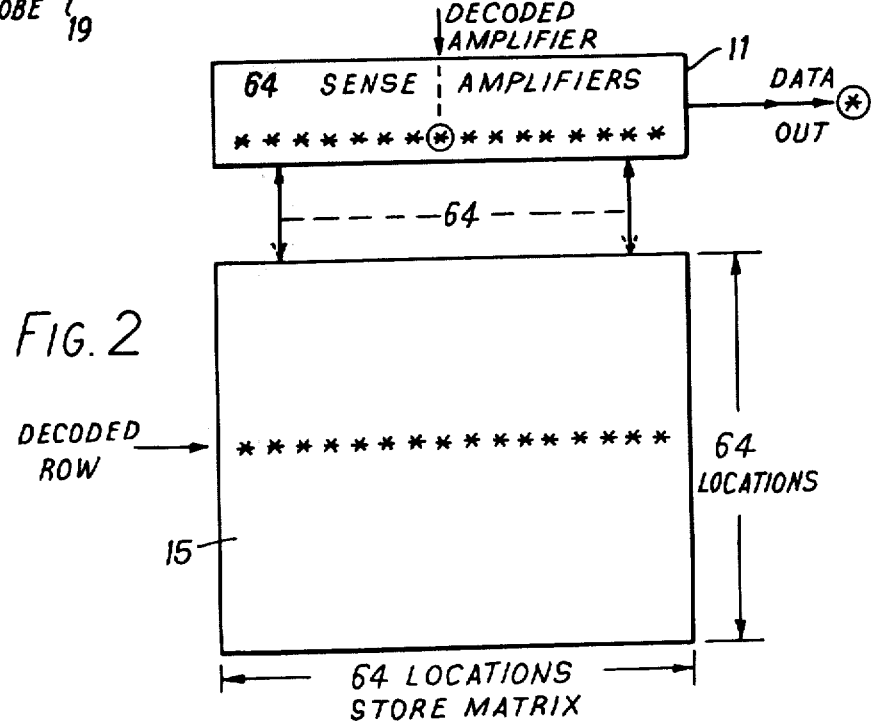

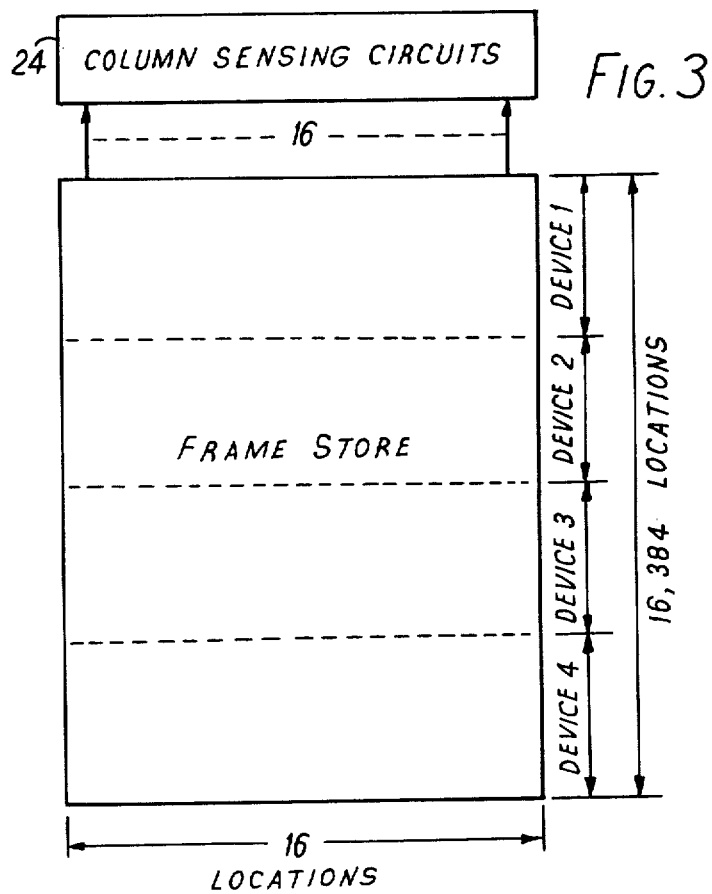
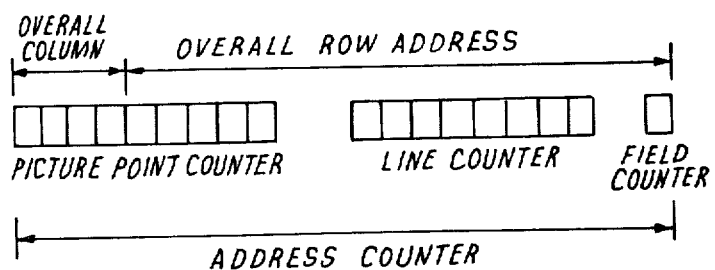
FIG.3

FIG. 8
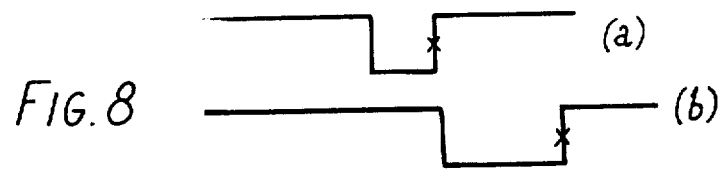
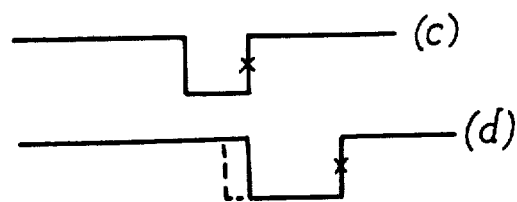
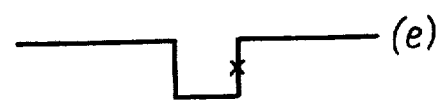
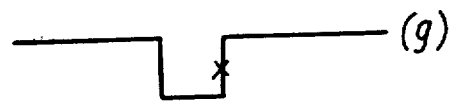
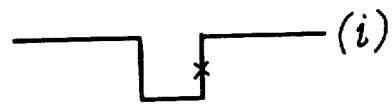
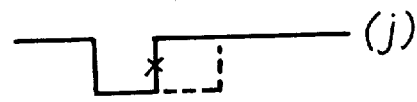
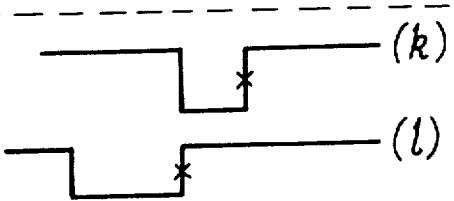

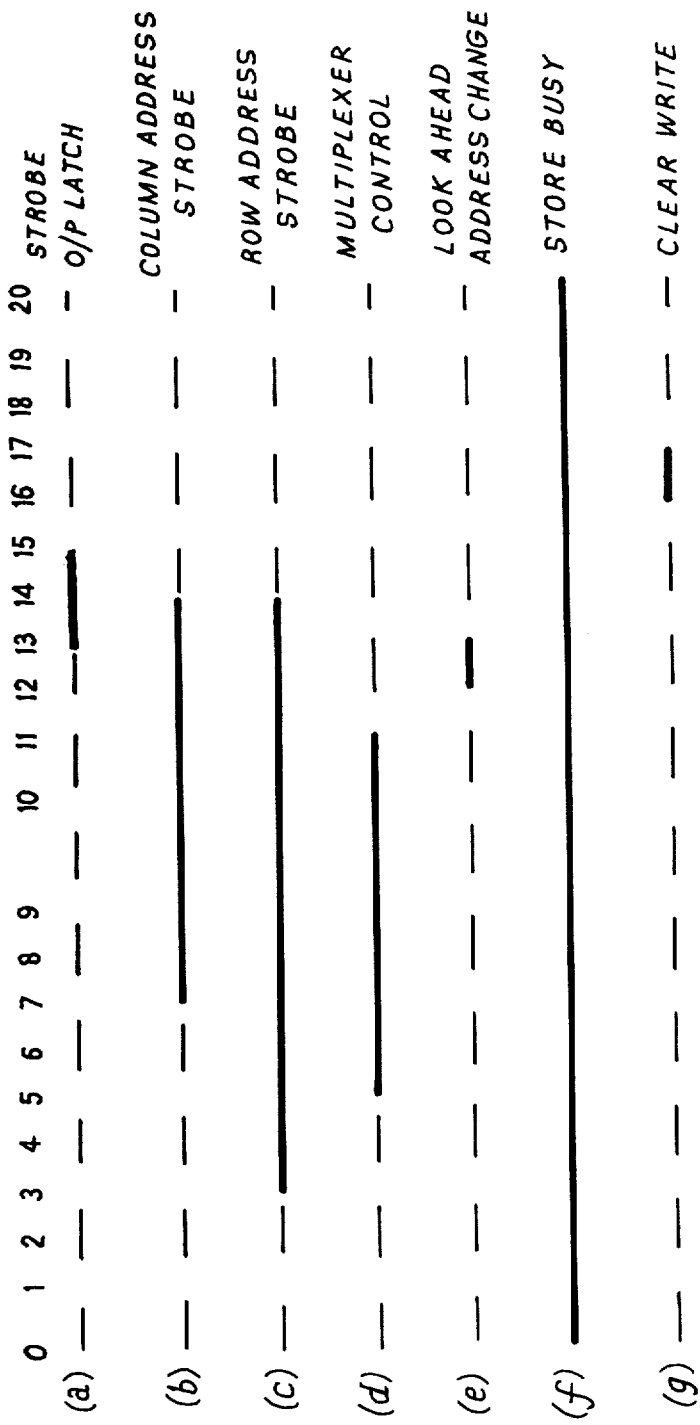

VIDEO STORE

BACKGROUND TO THE INVENTION

The invention relates to digital storage systems and more particularly to video storage systems.

The video storage system disclosed relates to a frame store and the means for controlling the frame store.

The frame store to be described is arranged as two fields of 256×512 words 8 bit wide in order that 512 video lines each containing 512 picture points may be held in memory.

This frame store is constructed with the 4096 bit N channel dynamic RAM (Random Access Memory) chip which has now become the industry standard for new generation semi-conductor memories. This element enables the physical size of the store to be considerably reduced in comparison to previous technologies and this in turn eases the design of the store architecture of video systems.

SUMMARY OF THE INVENTION

A video data store comprising at least one storage device containing a plurality of storage elements; at least one input data latch for holding incoming data until access to said storage device is gained; at least one output data latch for holding data from the storage device output after access is gained; queueing control means for receiving write and read store commands and for temporarily holding a received write or read store command if a store cycle is in progress; and timing means for receiving the write and read store commands from said queueing control means and for producing timing signals required for acessing said storage device.

The store may include a plurality of storage devices with associated latches together with input and output multiplexers connected to the latches and a valid data detector to allow cycling of that device to commence only if an enabling signal for the input latch of that device is detected.

BRIEF DESCRIPTION OF THE DRAWINGS

The invention will now be described, by way of example, with reference to the accompanying drawings, in which:

FIG. 1 shows a schematic block diagram of the constituent parts of the known 4096 bit RAM chip;

FIG. 2 shows the known mode of operation for the memory cycle for the single chip of FIG. 1;

FIG. 3 shows the architecture of the store of the invention containing 16 store cards with 32 chips on each card in a non-distributed arrangement;

FIG. 8 shows examples of the circuit waveforms of FIG. 7 undergoing the queueing process;

FIG. 10 shows the sequencing of signals provided from tappings of the delay lines of FIG. 9.

DESCRIPTTION OF THE PREFERRED EMBODIMENT

Figure 4:
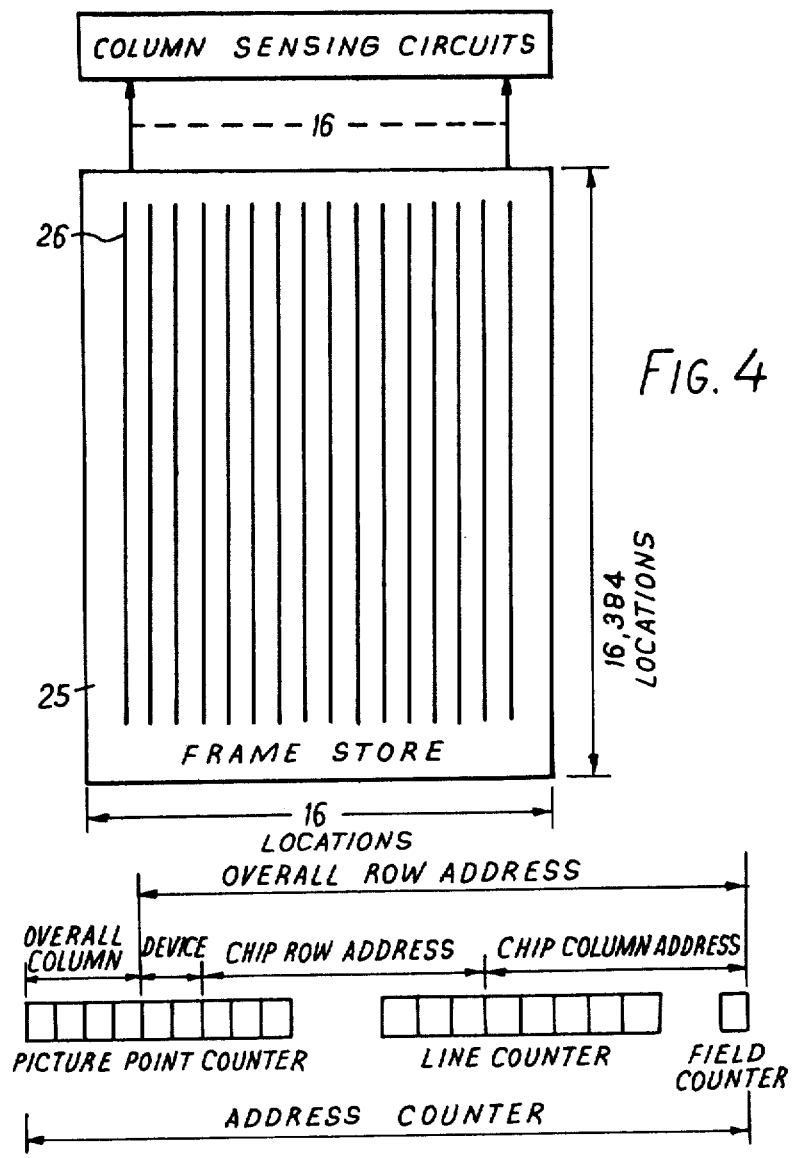
FIG. 4 shows a store arrangement similar to FIG. 3 but in which the store is in a distributed arrangement.

The single memory chip 10 of FIG. 1 comprises the 4096 bit N channel dynamic random access memory chip now commonly used by the computer industry.

The 4096 by 1 bit chip is available in a variety of speeds and packages. For the frame store, the 16 pin version was chosen since the smaller package and few address lines allows a significantly higher packing density to be achieved over the other larger but marginally faster devices.

A 16 pin package is made possible for an apparent 12 address bit, plus 4 power rails, plus 2 data rails and 3 control wires by multiplexing the address in two halves. This adds to the complexity of the store controller but becomes an insignificant overhead in a high capacity memory of the size required for a frame store.

The storage chip is dynamic having the advantage of very low power consumption but the disadvantage that the data stored must be refreshed every two milliseconds.

The single chip 10 is organised as a 64×64 bit memory matrix 15 with a sense amplifier 11 at the top of each column. The address is entered as two 6 bit words with the aid of "row address strobe" 19 and "column address strobe" 18. Strobing of the column latch 12 and row address latch 13 do not occur simultaneously, hence the input address rails 17 can be shared by both the column and row latches. A memory cycle is begun by supplying the row address and strobing it into the appropriate internal row address latch 13. At this point the operation of the chip is rather unusual in so much as the row address which has been decoded from the 6 bit row address information in the row latch by the 1 out of 64 row decoder 14 moves the entire 64 bits of data stored at each location in the chosen row in the matrix into the 64 sense amplifiers 11 attached to each column as shown in FIG. 2. Once the 64 bits of data have been read into the sense amplifiers, column address is strobed and one of the 64 sense amplifiers selected to output the data from the chip. All 64 bits of data are then returned to the matrix to achieve a non-destructive read characteristic. The address for the sense amplifier to select the correct one of the 64 bits is derived from the 6 bit column address received via the 1 out of 64 column decoder 16.

If it is required to write information, the data in the chosen sense amplifier is modified according to the input data before being returned to the matrix.

The advantage of this matrix organisation is that, for any one external address presented to the chip, the memory is exercised at 64 locations. Thus, instead of needing 4096 cycles to refresh the whole device, only 64 are required, (i.e. 4096÷64=64).

Since the refresh period must be less than 2 mS, the minimum frequency of operation for the store is $$64/(2\times 10^{-3}) = 32 \text{ KHz}$$

REFRESH TECHNIQUE

The conventional method of refreshing dynamic storage in the computer environment is to interrupt the memory periodically to enter refresh mode. This can either be achieved by interrupting every say 1.5 mS and exercising all the necessary addresses sufficiently quickly to ensure complete refresh is accomplished in one burst, or alternatively the refresh can be distributed so that every 30 μ s refresh is carried out at a single address with the address count to be incremented each time so that in 2 mS all 64 addresses are explored. These techniques are not so suitable for video stores since the regularity of the picture presentation imposes restrictions on the systems designer and does not allow random interrupts.

However, the very regularity that appears to cause difficulty if conventional refresh techniques are employed can be used to achieve refresh automatically if the apropriate address structure is chosen.

It has already been explained how the memory chip itself moves all 64 bits of data at the chosen row in the matrix to the 64 sense amplifiers and the appropriate bit is then decoded by column address. The architecture of the frame store is similar to this arrangement in order that a 15 MHz throughput capability can be achieved in spite of the cycle time of any individual device being appreciably slower. The matrix of the main store is in fact 16×4 devices giving 16 overall column address locations and 16,384 (i.e. 4×4096) overall row locations to create the necessary 512×512 picture points. These locations can be defined by an 18 bit address which splits conveniently into 9 bits to define the picture point in a line, 8 bits to define the line in the field and 1 bit to define which field is being used.

This arrangement is shown schematically in FIG. 3, however, although this scheme is admirable for allowing the necessary through-put rate it unfortunately cannot achieve automatic refresh.

Consider the way in which the picture could be formed. 16 consecutive picture points along a TV line are generated by one overall row address and are sensed at the top of each column by circuits 24. If the output from the column is examined serially the line can be formed in the conventional manner. Using this technique, the individual MOS devices are operated at 1/16 of video frequency. However, over 12 mS elapses from the time the overall row address count leaves device 1 until it returns again. This does not satisfy the requirements of refresh. FIG. 4 shows an alternative arrangement distributing the matrix so that adjacent rows are served by different devices. Thus, locations 0, 4 etc. go to device 1, locations 1, 5 etc. go to device 2, locations 2, 5 etc. go to device 3 and locations 3, 7 etc. go to device 4. The way the structure can be used to achieve refresh automatically now becomes clear. Also shown in FIG. 4 is the designation of the various bits of the main 18 bit address for overall matrix. The 4 least significant bits are associated with the column address (analagous to the accessing of the sense amplifiers in the store chip) the next two bits define which of the four devices making up the rows in the overall matrix is being used, the next 6 bits are the row address for the actual chips themselves and the 6 most significant serve as a column address for the chips.

Operation is the same as the non-distributed scheme of FIG. 3 but with the difference that since the row addresses for the chips themselves are formed from the 7 to 12 bits of the counter, all chip row addresses are examined at video frequencies times $2^{-11}$ or approximately every 0.2mS for a 10 MHz system.

It can also be shown that the line of field blanking groups can be bridged since even though the address counters are stopped during these periods, the total refresh time is less than the requisite 2 mS.

It is a feature of this invention that choosing the most significant bit of the address as the field counter ensures that if a type of display is being employed where a single stored field is being repeated twice in every frame, the entire store is still refreshed since all the bits of the counter associated with refresh are still explored.

STORE CARD

It has already been explained how the frame store matrix 25 comprises 16 locations by 16,384 locations, or alternatively 16 locations by 4 devices (remember each device being 4096 bits).

Now the 16 locations that have been referred to are in fact 16 separate store cards 26, each card carries 4 devices giving the 16,384 locations referred to earlier. The store card is arranged that the data is fed to all cards on a common highway and is read from all cards on a common highway.

Figure 5:
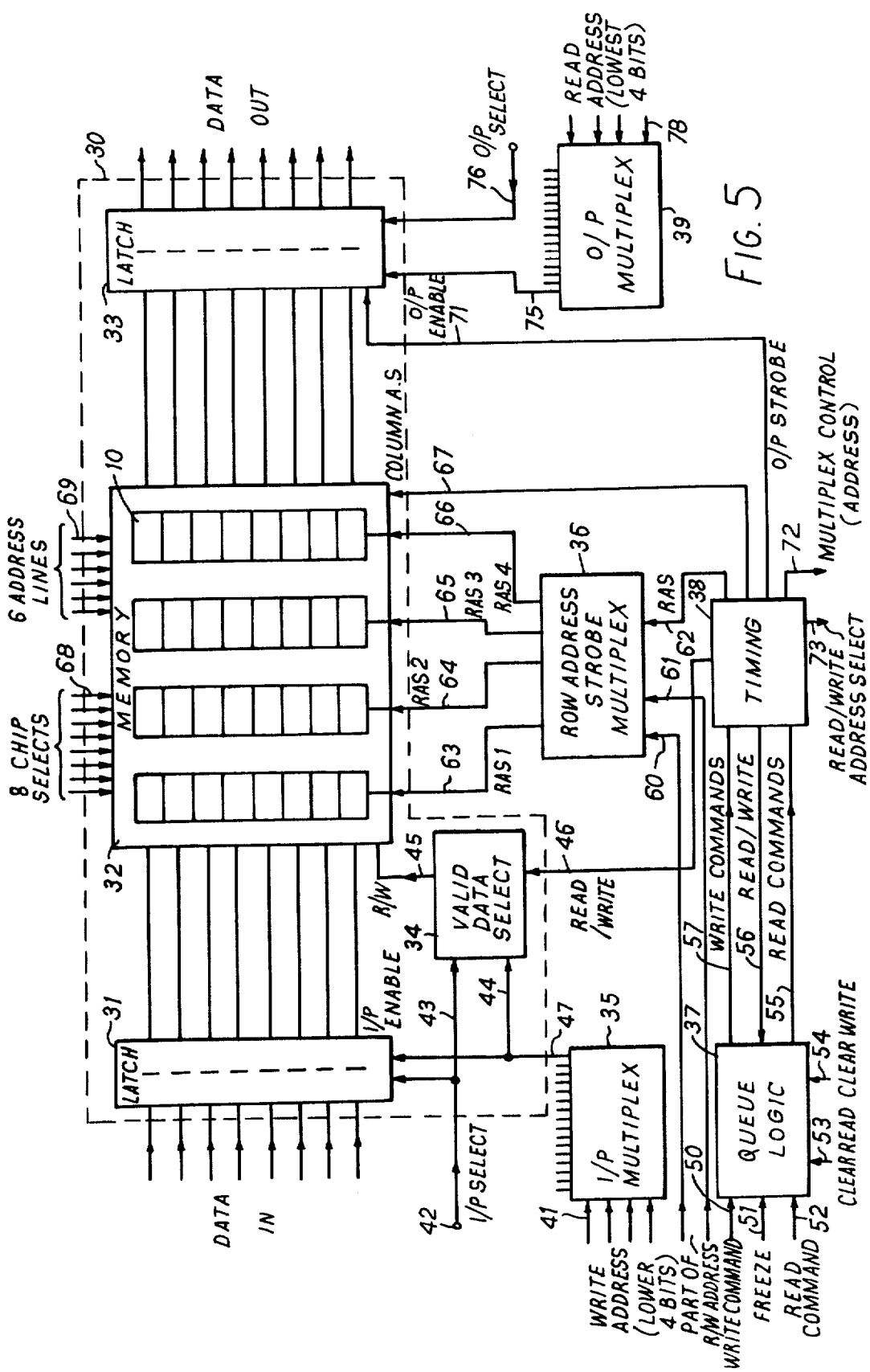
FIG. 5 shows one store card of the invention containing 32 chips each of the type shown in FIG. 1 together with input and output registers and the store control arrangement.

FIG. 5 shows the store control together with one of the 16 store cards. The store card 30 includes block 32 of 4 rows of RAM chips 10 (the card being shown moved through 90°), each row comprising 8 chips (one for each of the 8 data bits). Thus, the total number of storage chips is 32. The card 30 includes input latches 31 and output latches 33. The card also includes a valid data detector 34 described in more detail below. It is to be remembered that 15 other similar cards 30 (not shown) complete the store. Thus, an input multiplexer 35 has 16 outputs 47 for the 16 cards. One output is shown connected to the latch 31. Similarly, an output multiplexer 39 is shown with one output 75 connected to output latch 33. Although the remaining outputs of the input and output multiplexers are shown without connections, these in fact are connected to the other 15 cards. A row address strobe multiplexer 36 and timing control 38 provided have outputs commonly shared by the other 15 cards. A queueing logic circuit 37 (described below) is connected to the timing control 38.

Now since the input data for the cards comes via a common highway, this data must be latched into each card in turn by individual clocks so that after 16 clock periods, all 16 cards hold one word of data.

These first words are held in the first position in latches 31. Latches 31 may be provided by known register file chips (e.g. 2×74LS170 which is a 4 bit 4 location register, only 2 locations being used). The information is clocked into these files by the input enable signal, at video frequency received from input multiplexer output 47 and the address is set by input select signal received at input 42. Now when the first 16 words have been passed to the cards, the next 16 words appear in sequence on the highway and are again latched into the cards, except this time input select is changed so that these latest words are entered into the next position in the register file 31.

It will be clear that input select is, therefore, changing at 1/16 the original video frequency (as there are 16 cards). The output of the register files is controlled by the inverse of input select, this is all that is necessary to present the contents of the known registers on their output terminals. Now since input select is operating at 1/16 the video frequency, it will be obvious that the data presented on the outputs of the register files will be held constant for approximately 16 times the data period present on the original input highway.

Since the 4096 bit RAM chip is relatively slow in its operation, this internal demultiplexing is necessary to reduce the speed requirement for any individual chip. However, the external addressing system is still that of a conventional array. (The 9 bit binary address defines the line in the picture and another 9 bit address defines the picture point within the line as explained above.)

It will be clear that this demultiplexing, or apparently slowing down the input data has been achieved, and the input data is present on the input terminal of the 4 K RAM for more than sufficient time for the RAM to absorb the information.

Now the addressing for the RAM has already been described and enters as just 6 address lines at input 69 which carry the 12 bit address multiplexed in two halve (i.e. chip row address followed by chip column address). The individual device is selected by having 4 separate row address strobes RAS 1, 2, 3 and 4 on lines 63, 64, 65 and 66 respectively from row address strobe multiplexer 36 which receives row address strobes (RAS) from timer 38 at input 62, only one operating for each store cycle. These, of course, operate in turn, so the sequence of events for an address structure is the first 4 bits of the address entering at inputs 41 representing 16 cards are decoded to produce the input enables from input multiplexer 35, the next two bits of address entering at inputs 60, 61 are decoded in the row address strobe multiplexer 36 to produce the 4 row address strobes RAS 1, 2, 3 and 4. The final 12 bits are the main device address multiplexed in two halves to input 69. Column address strobe (CAS) is provided on line 67 from timer 38.

The output structure for the card is very similar to the input structure except of course it operates in reverse. Essentially, data is transferred in parallel from all 16 cards into their respective registers or latches 33. (The output latches 33 may be provided by four 4 bit latches type 74173 to give the required 8 bit×2 locations.) This transfer to the latches is effected by 'output strobe' received from timer 38 on line 71 and the register selected by 'output select' received externally at input 76. 'output strobe' and 'output select' operate at 1/16 video frequency. The registers not occupied with the parallel transfer from the RAM are available for outputtting their data onto the main highway by means of 'output enable' received from output 75 of output multiplexer 39 receiving a 4 bit read address at inputs 78; the appropriate device being chosen by the inverse of 'output select'. 'Output enable' operates serially (at video frequency) whereas 'output strobe' operates for all 16 cards in parallel.

The 8 chip select lines 68 enable any part of the digital word in store to be disabled and protected from the writing process if required. Thus, a different picture can be written in bits, say 1 to 4 than that held in bits 5 to 8.

The read/write lines and row address strobes (RAS) for the store card is not as straightforward as might have first been imagined. The complication is caused by what happens if one card in the group of 16 wants to be written into without any other cards being affected. This is simply achieved for input latches 31 by operating only the input enable corresponding to the card in question. However, when the data is transferred across in parallel, the store locations in 15 of the 16 cards would be receiving false information.

To prevent this receipt of false information the valid data detector 34 is provided which receives input selects and input enables at inputs 43 and 44 respectively, together with read/write signals at input 46 from timer 38. If an input enable is detected for this card from input multiplexer 35, the detector 34 allows the data entered into the latch 31 to be subsequently transferred to the store under control of read/write from output 45. If an input enable for that particular card is not received from input multiplexer 35, then the detector will not allow the store cycle to proceed.

Queueing logic block 37 also receives read/write signals on line 56 from timer 38. Write commands are received at input 50 of queueing circuit 37 and read commands at input 52. Freeze input 51 to block 37 holds the data in the store. Write commands are received by timing circuit 38 from output 57 and read commands are provided from output 55 which are arranged to be temporarily held in block 37 if the store is busy with another part of its cycle which is detected from the read-write signals at input 56. Clear read and clear write facilities are provided at inputs 53 and 54 respectively. Additional timing signals are provided from timer 38 which are read/write address select at output 73 and multiplex address control at output 72 for use with the RAMs in known manner for addressing. Such addressing can be provided by three separate counters for write, read and refresh.

Figure 6:
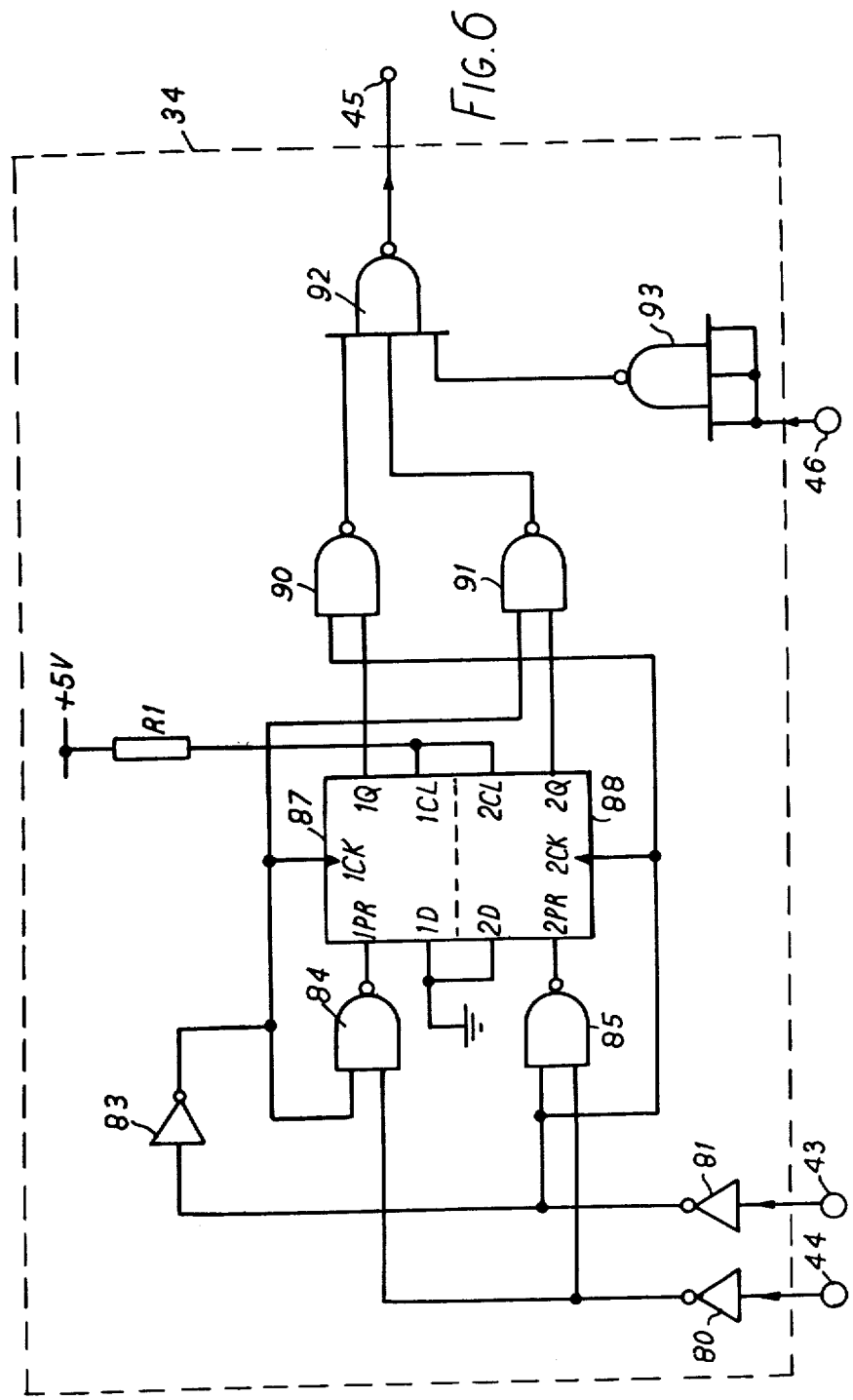
FIG. 6 shows one configuration for the circuit of the valid data detector of FIG. 5.

A circuit arrangement for valid data detector 34 is shown in FIG. 6. The circuit 34 comprises inverters 80, 81, 83, NAND gates 84, 85, 90, 91, 92 and 93 and dual flip flops 87, 88. The input enable signal from 44 is inverted in inverter 80 and passed to one input of NAND gate 84 and one input of NAND gate 85. The input select signal from 43 is passed via inverter 81 to the other input of NAND gate 85. The inverter 81 output is applied via a further inverter 83 to the other input of gate 84. The output of gate 84 is received by the preset input of 'D' type latch 87. The output of gate 85 is received by the preset input of another 'D' type latch 88. (Latches 87 and 88 could comprise the two halves of dual 'D' type latch integrated circuit type 7474.) The clock input of latch 87 receives the output from inverter 83. The preset input of latch 88 receives the output from gate 85. The clock input of latch 88 receives the output from inverter 81. The clear inputs of latches 87, 88 are connected via resistor R1 to the +5 V rail. 'D' inputs of the latches are connected to ground. The 'Q' output of latch 87 is received by one input of NAND gate 90 and receives the output of inverter 81 at its other input. NAND gate 91 receives the 'Q' output of latch 88 at one input and the output of inverter 83 at its other input. The output of gates 90, 91 are received by NAND gate 92 which receives at its third input the read/write signal via NAND gate 93 connected as an inverter. The output of gate 92 is provided to the stores at output 45. Inverters 80, 81 and 83 could all be provided from Hex inverter type 7404. NAND gates 84, 85, 90, 91 could be provided by Quad Nand chip type 7400. NANDs 92, 93 could both be provided by chip type 7410. The circuit of FIG. 6 will only allow read/write signals from 46 to activate store cycle at output 45 when an input enable is detected at input 44 to set 'D' type latch (i.e. when that card is being selected by the input multiplexer 35 of FIG. 5.) Thus false information is prevented from being written into the store.

Returning to FIG. 5, consider the timings for the input latches to the store itself and output latches. Take for example an input video frequency of 10 MHz, the input latches are being clocked at 10 MHz serially and therefore input select will be changing with a period of 16 times 100 nS or 1.6 μs. Therefore the RAM itself has 1.6 μs in which to absorb the information waiting on the output of these latches.

But the RAM itself only needs 500 ns. The situation on the output is exactly the same, the store can transfer information to the output latches in 500 ns but a 1.6 μs gap is available for this transfer since output select is toggling at a period of 1.6 μs.

As writing into the store and read out are asynchronous, it is necessary to ensure that write and read commands do not overlap. Queueing logic block 37 allows demands coming into the store card to queue so that if say the store is busy with a read cycle, transferring information to the output latches when an asynchronous demand for a write cycle (i.e. write command signal) appears the queueing logic 37 makes this write command queue until the store has finished reading and is available for writing. Since the store cycle time is less than half the period of either input or output select, the store is always, when necessary, able to accomplish both read and write in one input select or output select period. By providing this queueing facility, it will be seen that provided the cycle time of the store including the necessary setting-up of addresses is less than half the period of input select or output select, whichever in the asynchronous condition is changing fastest, then it is impossible for a crash condition to occur. The entire frame store operates asynchronously with the input and output digital video words appearing continuous although internally to each card this queueing mechanism is taking place. It can also be seen that these conditions are met even if one input is moving very slowly with respect to the output or vice versa or when both in input and output are operating at maximum speed synchronously.

Figure 7:
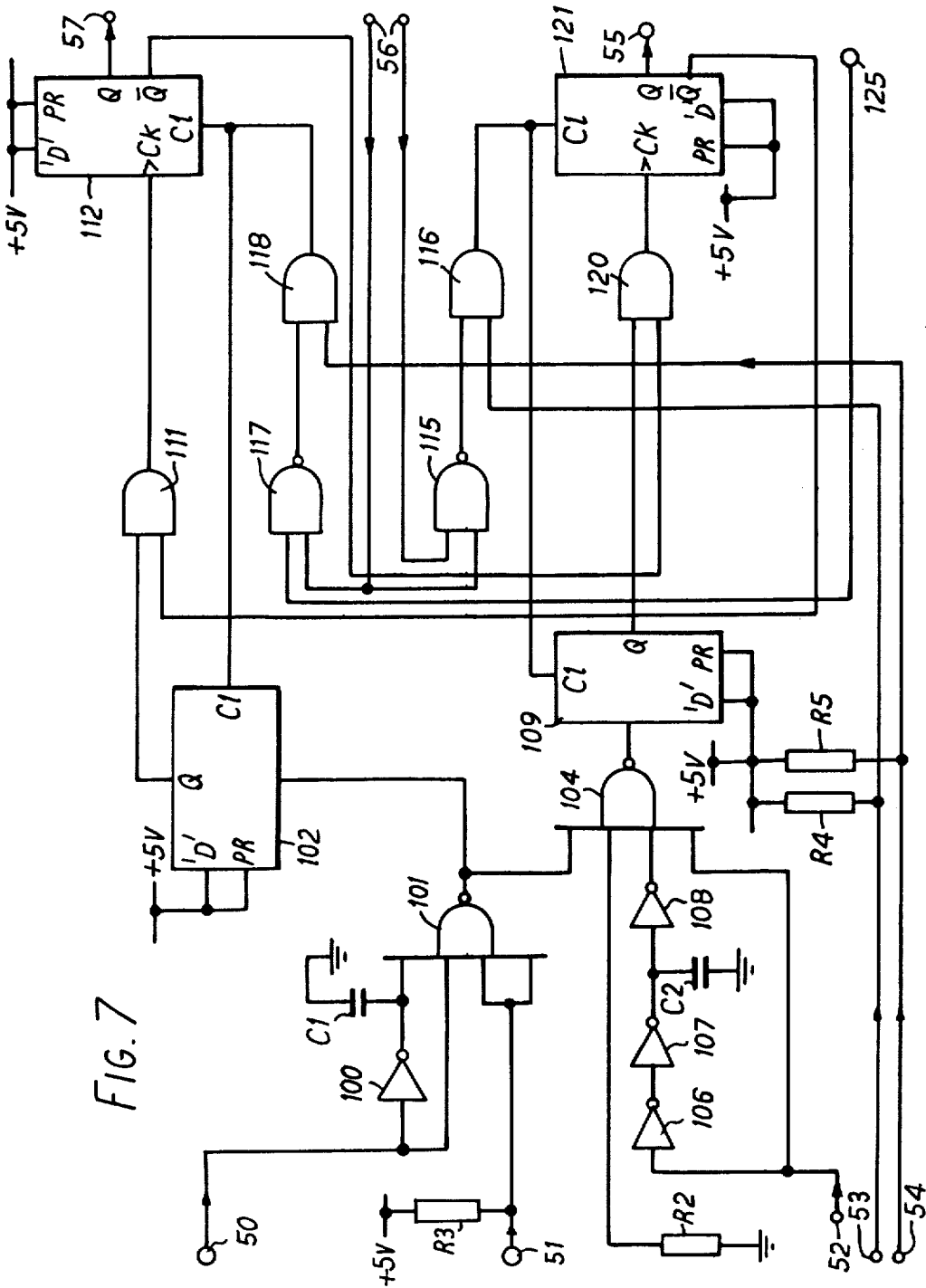
FIG. 7 shows one configuration for the queueing logic circuit of FIG. 5.

A circuit arrangement for the queueing logic block 37 of FIG. 1 is shown in FIG. 7. In addition, FIG. 7 has a further input 125 which comes from timer 38 and is described in more detail with respect to FIG. 9. Write command input 50 is connected to one input of a NAND gate 101 directly and via inverter 100 with associated capacitor C1 to another input of gate 101. The freeze input 51 is connected to the other input of gate 101 which input is connected via resistor R3 to the +5 V rail. The output of gate 101 is connected to the clock input of a 'D' type flip flop 102, and also to one input of a further NAND gate 104.

A second input of gate 104 is connected to ground via resistor R2. A third input receives the read commands directly. A further input receives the read commands via three series connected inverters 106, 107 and 108. A capacitor C2 is connected between ground and the output of inverter 107. The output of NAND gate 104 is received by the clock input of 'D' type 109. For read/write line 56, read line (Hi for read) is connected to one input of NAND gate 115. The write line (Hi for write) is connected to the other input of gate 115 and to one input of a further NAND gate 117 (write is the inverse of read). The other input of gate 117 is connected to receive the look ahead address change signal at input 125. The output of gate 117 is connected to one input of AND gate 118. The other input of gate 118 receives 'clear write' signals from input 54. The output of gate 115 is connected to one input of AND gate 116. The other input of gate 116 is connected to 'clear read' input 53. The lines from 53 and 54 are respectively connected to 'clear read' input 53. The lines from 53 and 54 are respectively connected via resistors R4, R5 to the +5 V rail. The 'clear' input of flip flop 102 is connected to the clear input of a further flip flop 112, which both receive the output from AND gate 118.

The clear input of flip flop 109 is connected to the clear input of flip flop 102 which both receive the output of AND gate 116.

The Q output of 102 is connected to one input of AND gate 111 and the other input of gate 111 receives the Q output of flip flop 121. The output of gate 111 is received by the clock input of flip flop 112.

The Q output of flip flop 112 is connected to one input of AND gate 120 which has its other input connected to the Q output of flip flop 109.

The 'preset' and 'D' inputs of flip flops 102, 109, 112, 121 are all connected to the +5 V rail.

The write command output 57 is provided by the Q output of flip flop 112. The read command output 55 is provided by the Q output of flip flop 121.

Inverters 100, 106, 107, and 108 could all be formed from Hex Inverter type 7404. Flip flops 102, 109, 112, 121 could be formed from 2 Dual 'D' type chips 74S74. NAND gates 115, 117 could be I.C. Chip type 74S00. NAND gates 101, 104 could be type 74S140. AND gates 111, 116, 118, 120 could be type 74S08.

Write commands therefore enter the queueing circuit of FIG. 7 at input 50 and are turned into a short pulse of width t due to delay through inverter 101 by gate 101. The output of 101 acts as a pulse generator to set 'D' type flip flop 102 where Q output in the quiescent state passes through gate 111 which is open and sets 'D' type latch 112. Now the action of setting 112 closes AND gate 120. So now a read command entering at input 52 via pulse generator arrangement provided by elements 106, 107, 108 and 104 (of width 3t due to delay through 106, 107 and 108) can set 109, but the output of latch 109 is inhibited by AND gate 120 being closed. Latches 102 and 109 therefore are storing or memorising a write command or a read command. Flip flops 112 and 121 indicate which particular type of command the store is handling at any given moment. Clearly both 112, and 121 being set at the same time is a disallowed condition, and the queueing arrangement is designed to avoid this. The necessary protection is supplied via AND gates 111 and 120, however, the propagation delay between a pulse leaving the pulse generator 101 or 104 and the time before 120 or 111 is locked out is too long to protect against the simultaneous arrival of read and write commands. The necessary further protection is achieved by the extra input to 104 coming from the output of 101.

Consider now the diagram shown in FIG. 8, this diagram shows a "passover" of read and write commands. The upper waveform of each pair is the output of gate 101 and the lower waveform is the output of gate 104. The write command received via gate 101 indicated by the narrow pulse remains fixed and the read command via gate 104 is moving showly back through it.

The first pair 8a and 8b show a conventional situation where there is no interaction and ample time for the normal locking out of AND Gates 111 and 120 to protect the store against the disallowed condition. The same is true of the next pair 8c and 8d. The third pair, however, 8e and 8f show the read pulse 8f being foreshortened slightly and this is due to the action of the wire joining 101 to the input of 104. However, there is still ample separation between the two positive edges which are those that set 102 and 109. Now on the fourth pair 8g and 8h it will be seen that in fact the read pulse has been distorted now into two pulses, the second of the two is too close to the positive edge of the write command and a crash condition would occur. However, 'D' type 109 would have been set by the first positive edge coming out of gate 104 and this, due to the length of the pulse out of gate 101, is amply separated from the write command edge. Same is true of the fifth pair 8i and 8j. The sixth pair 8k and 8l shows the final condition where again read is completely separated from write.

Having therefore demonstrated that flip flops 112 and 121 are now protected from being set at the same time irrespective of the time of arrival of read and write commands the action of the timer 38 of FIG. 5 controlling the sequencing of the store can be discussed.

Figure 9:
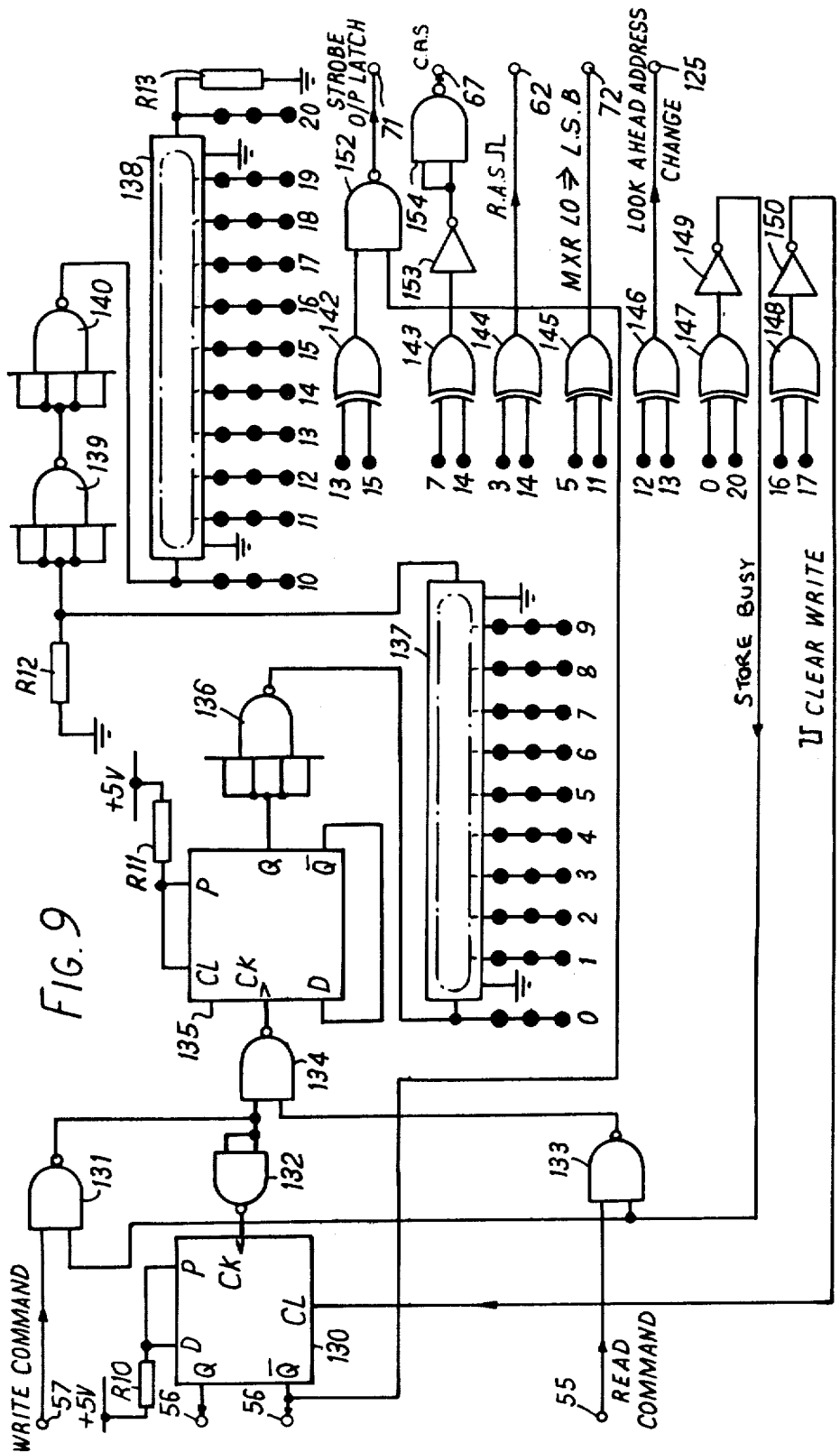
FIG. 9 shows one arrangement for the timer of FIG. 5.

An arrangement for timing control 38 is shown in FIG. 9. Write command input 57 is connected to one input of NAND 131 and has its output connected to further NANDS 132, 134. The output of gate 132 is received by the 'clock' input of 'D' latch 130. Latch outputs Q and Q are for read/write line 56. The 'D' and preset terminals of latch 130 are connected via R10 to +5 V rail. Read command input 55 is connected to the one input of NAND gate 133 and its other input is coupled to the second input of gate 131. Gate 133 output is connected to the second input of gate 134 which has its output connected to clock input of latch 135. The clear and preset terminals of latch 135 are connected via R11 to +5 V rail. Q output is connected to NAND 136 and Q and D are strapped together. Gate 136 output is connected to delay line 137 which delay is connected in series with a further delay 138 via gates 139 and 140 and associated resistor R12. The output of delay 138 is connected to ground via R13. Some of the tappings 0–9 and 10–20 of delays 137, 138 are connected to various 'exclusive or' gates 142–148, the tapping numbers being clearly seen from the drawing. Gate 142 output is connected to one input of a NAND gate 152 which has its second input connected to the Q output of latch 130. The output 152 is connected to terminal 71. Gate 143 is connected via inverter 153 to NAND 154 which has its output connected to terminal 67. Gate 144 output is connected to terminal 72. Gate 146 output is connected to look ahead address change terminal 125. Gate 147 output is connected via inverter 149 to gates 133 and 131 to provide 'store busy'. Gate 148 is connected via inverter 150 to the clear terminal of latch 130.

The latches of FIG. 9 could be of similar type to those of FIG. 7 as could the NANDs and inverters. Exclusive ORs 142–148 could be type 74LS86 and delays type 270T250.

Let us assume that a write command is received at input 57. Gate 131 is open and the pulse passes via gate 134 to clock the D type latch 135. Now latch 135 is arranged as a simple one bit counter so that the state of the Q output changes and an edge travels via gate 136 down the delay lines 137, 138 (through gates 139, 140). Now as the edge travels down the delay lines the first signal to be created via the 'exclusive or' gates connected to the delay line taps is the store busy signal created at gate 147. This signal returns via inverter 149 to lock-out gates 131 and 133 so that if another command is received this is ignored by the delay line. Gate 144 produces 'row address strobe'. Gate 145 controls the multiplexer changing the addresses for row and column. Gate 143 produces 'column address strobe'. Gate 142, gated by gate 152, produces the output latch strobe for the store cards ensuring that the data is transferred at the right moment into the output latches. Gate 146 which produces 'look ahead' address change and gate 148 produces 'clear write' via inverter 150.

Operation of the delay lines by gates 131 and 132 is the same as for the write cycle with the exception that latch 130 whose action is described later, is not used during the read cycle.

Returning to the operation for a write cycle, it has already been explained how the write command passes through gates 131 and 133 into the delay line, now at the same time the output of 131 via gate 132 sets D type flip flop 130. This flip flop being set designates a write cycle taking place and is cleared by the 'clear write' signal coming from gate 148. This extra flip flop 130 is required since write command (received from latch 112 of FIG. 7) can get cleared before the end of a write cycle because of the 'look ahead address' change function via gates 117, 118 of FIG. 7. 'Look ahead address' change is allowed because the RAM devices lock out the address inputs part way through the cycle, therefore use of this time can be made to set up the next address whilst waiting for the store busy signal to disappear. In this way, higher throughput rates are capable from the system since the cycle time of the whole store is reduced to the basic time of the RAM itself since no account has to be taken of setting up addresses since this is accomplished by the 'look ahead address' mechanism. 'Look ahead address' mechanism is initiated (see FIG. 7) by a pulse arriving at terminal 125, this pulse is routed via gate 117 or gate 155 depending upon whether a read or write cycle is taking place. If, for example, the cycle is a 'write' cycle with a 'read' queueing at gate 120, 'look ahead address' change will pass through gate 177 due to the input on line 56, gate 118 is open and so latch 112 will be cleared.

The read/write line itself 56 is controlled by the states of flip flops 112, 121. The action of clearing latch 112 automatically opens gate 120 which sets latch 121 which change of state can be used to provide a change of address from write to read at output 73. It will be clear that 'look ahead address' change has been accomplished since gates 131 and 133 of FIG. 9 ensure that even if latches 112, 121 of FIG. 7 have been cleared by the 'look ahead address ' change signal and the other corresponding gate 121 or 112 is then set the read/write line changes but an edge does not start down the delay line until allowed by the store busy signal opening gate 131 and 133.

Gates 118 and 116 of FIG. 7 are necessary since an examination of the circuit will show that it is in fact not self-starting and if it happens to turn on with latch 112 and 121 set together, the whole circuit is locked out. This condition is guarded against by allowing an occasional reset pulse to appear via 118 and 116 which resets only appear when the write or read function of the store is not being used.

The sequence of waveforms produced via delay lines 137 and 138 are shown in FIG. 10 in which the numbers 0–20 relate to the tappings on the delay lines.

Input multiplexer 35 is of known construction and could be provided by two Decoder Chips type 74S138. Output multiplexer 39 could similarly be constructed. Row address strobe multiplexer 36 could be constructed from one Decoder Chip type 74S138.

Thus the store and control of the invention allow for completely asynchronous operation; that is the input and output video frequencies can be totally different and need have no phase or frequency relationship with one another. In fact information can be put in at say one picture point per hour and the output still produce conventional TV frame rate display at 15 MHz.

Although the store has been described relating to a frame store, the store capacity could be changed to that of a field store or smaller capacity store.

Although 4 rows of chips 10 are shown in FIG. 5, this may be any number (e.g. 7 rows) and row address multiplexer 36 would be modified to produce the correct number of row address strobes.

The storage system described above can be used for example in the video synchroniser disclosed in British Patent Application No. 6588/76 and in the video processing system disclosed in British Patent Application No. 3731/76.

I claim:

1. A video data store capable of asynchronous operation to allow data write in and read out from the video store to be effected at times unrelated to each other, said video data store comprising:
   at least one storage device containing a plurality of storage elements;
   at least one input data latch for holding incoming data until access to said storage device is gained;
   at least one output data latch for holding outgoing data from the storage device after access is gained;
   queueing control means for receiving write and read store commands and for temporarily holding a received write or read store command if a store cycle is in progress; and
   timing means for receiving the write and read store commands from said queueing control means and for producing timing signals required for accessing said storage device.

2. A video data store according to claim 1, wherein said timing means includes a tapped delay line with a plurality of gates connected to tappings on the delay line to provide timing signals for said store and includes input gating means connected to receive write and read commands from said queueing control means, an output of said input gating means being connected to the delay line via latching means, said input gating means including a detector for determining when the store is busy and wherein output latching means are provided in said timing means to provide a signal dependent on whether a read or write cycle is occurring.

3. A video data store according to claim 2 wherein said input gating means comprises first and second NAND gates each having one input connected to an inverter and exclusive OR gate connected across said delay line to form said busy detector; and a second input of the first and second NAND gates being connected respectively to write and read command inputs, the output of said first and second NAND gates being connected to inputs of a third NAND gate connected to the delay line via said latching means.

4. A video data store according to Claim 1, wherein said store includes a plurality of storage devices with associated input and output latches and further comprises:
   an input multiplexer having an output connected to the input data latches of each storage device to enable respective ones of said latches;
   an output multiplexer having an output connected to the output data latches of each storage device to enable respective ones of said latches;
   and wherein a valid data detector is provided for each storage device to allow cycling of that device to commence only if an enabling signal for the input latch of that device is detected.

5. A video data store according to claim 4 wherein said valid data detector comprises input gating means for receiving input enable and input select signals controlling the input latches of the storage devices, latching means for holding the input enable and select signals detected by said input gating means, and output gating means connected to the latching means output and to a write input to allow a write signal to pass only if an input enable for that device has been detected.

6. A video data store according to claim 4, wherein said storage devices contain sufficient storage to provide a video frame store.

7. A video data store according to claim 4 wherein the storage elements of each said storage device are arranged in a matrix of rows and columns and said timing signals include row address and column address signals for accessing the elements within each said storage device.

8. A video store according to claim 7, wherein the matrix of each storage device is subdivided into a number of distinct portions each containing a plurality of elements arranged in rows and columns and wherein multiplexing means are provided for multiplexing the addressing signals from said timing means to sequentially access the subdivided portions of each device.

9. A video data store according to claim 1, wherein said queueing control means comprises first and second latching means for respectively receiving and storing the write and read commands;
   third latching means connected to said first latching means to provide a write command output when detected in said first latching means;
   fourth latching means connected to said second latching means to provide a read command output when detected in said second latching means;
   first gating means connected between said first and third latching means, and second gating means connected between said second and fourth latching means to prevent simultaneous setting of said third and fourth latches.

10. A video data store according to claim 9, wherein said first gating means comprises an AND gate having a first input connected to the output of said first latching means and a second input connected to receive the output of said fourth latching means; and said second gating means comprises an AND gate having a first input connected to the output of said second latching means and a second input connected to receive the output of said third latching means.

11. A video data store according to claim 9, wherein said queueing control means includes further protection means comprising a first pulse generator connected to the input of said first latching means to provide a narrow pulse on receipt of a write command and a second pulse generator means connected to said second latching means and said first generator means to produce a pulse of a width three times that produced by said first pulse generator unless inhibited by said first generator output.

12. A video data store according to claim 11, wherein said first pulse generator means comprises a NAND gate having a first input connected to the output of an inverter and a second input connected to the input of said inverter to provide a pulse of width dependent on the delay through said inverter and said second generator means comprises a NAND gate having a first input connected to the output of said first generator means, a second input connected to the output of three series connected inverters and a third input connected to the input of the series connected inverters to provide a pulse dependent on the delay through the three inverters unless inhibited by the output from said first generator means.

13. A video data store according to claim 12, wherein the NAND gate of said first generator includes a third input for inhibiting the production of pulses therefrom to prevent further writing into said store.

* * * * *